(12) United States Patent
Mehalel

(10) Patent No.: US 6,885,230 B2
(45) Date of Patent: Apr. 26, 2005

(54) ADAPTIVE DELAY OF TIMING CONTROL SIGNALS

(75) Inventor: Moty Mehalel, Haifa (IL)

(73) Assignee: Intel Corporation, Santa Clara, CA (US)

( * ) Notice: Subject to any disclaimer, the term of this patent is extended or adjusted under 35 U.S.C. 154(b) by 114 days.

(21) Appl. No.: 10/402,137

(22) Filed: Mar. 31, 2003

(65) Prior Publication Data

US 2004/0189368 A1 Sep. 30, 2004

(51) Int. Cl.$^7$ .............................................. H03H 11/26
(52) U.S. Cl. ...................................................... 327/261
(58) Field of Search .............................. 327/39, 41–44, 327/47, 49, 161, 261–263, 276–278, 284–285, 291–292, 299

(56) References Cited

U.S. PATENT DOCUMENTS

| | | | | |
|---|---|---|---|---|
| 3,794,766 A | * | 2/1974 | Cox et al. ..................... | 381/66 |
| 5,087,842 A | * | 2/1992 | Pulsipher et al. ............ | 327/270 |
| 6,194,937 B1 | * | 2/2001 | Minami ....................... | 327/270 |
| 6,333,660 B1 | * | 12/2001 | Taguchi et al. .............. | 327/292 |
| 6,339,353 B1 | * | 1/2002 | Tomita et al. ............... | 327/210 |

* cited by examiner

*Primary Examiner*—My-Trang Nu Ton
(74) *Attorney, Agent, or Firm*—Fleshner & Kim, LLP

(57) ABSTRACT

Embodiments of the present invention relate to a circuit that varies the delay time of a clock signal in response to a frequency of the clock signal. The circuit may include a sensor and a delay circuit. The sensor may output a determination of the frequency of the clock signal. The delay time of the delay circuit may be responsive to the determination of a frequency of the clock signal. Accordingly, when the frequency of a clock signal varies, a delay of that clock signal can be varied to accommodate for the change in frequency.

38 Claims, 11 Drawing Sheets

ADAPTIVE DELAY OF TIMING CONTROL SIGNALS

BACKGROUND OF THE INVENTION

1. Field of the Invention

The field of the invention generally relates to electronics.

2. Background of the Related Art

Electronics are very important in the lives of many people. In fact, electronics are present in almost all electrical devices (e.g., radios, televisions, toasters, and computers). Many times electronics are virtually invisible to a user because they can be made up of very small devices inside a case. Although electronics may not be readily visible, they can be very complicated. It may be desirable in many devices for electronics to operate at fast speeds. This may be important, as many devices utilize electronics to process data or information. Accordingly, the faster a device can operate, the more data or information that can be processed in a given amount of time. For example, a DVD player processes data at a faster rate than a CD player, because reproducing moving images stored on a DVD is more intensive than reproducing audio stored on a CD.

DETAILED DESCRIPTION OF PREFERRED EMBODIMENTS

Electrical hardware (e.g., a computer) may include many electrical devices. In fact, a computer may include thousands of electrical devices (e.g., transistors, resistors, and capacitors). These electrical devices must work together in order for hardware to operate correctly. Accordingly, electrical devices of hardware may be electrically coupled together. This coupling may be either direct coupling (e.g., direct electrical connection) or indirect coupling (e.g., electrical communication through a series of components).

Figure 1:
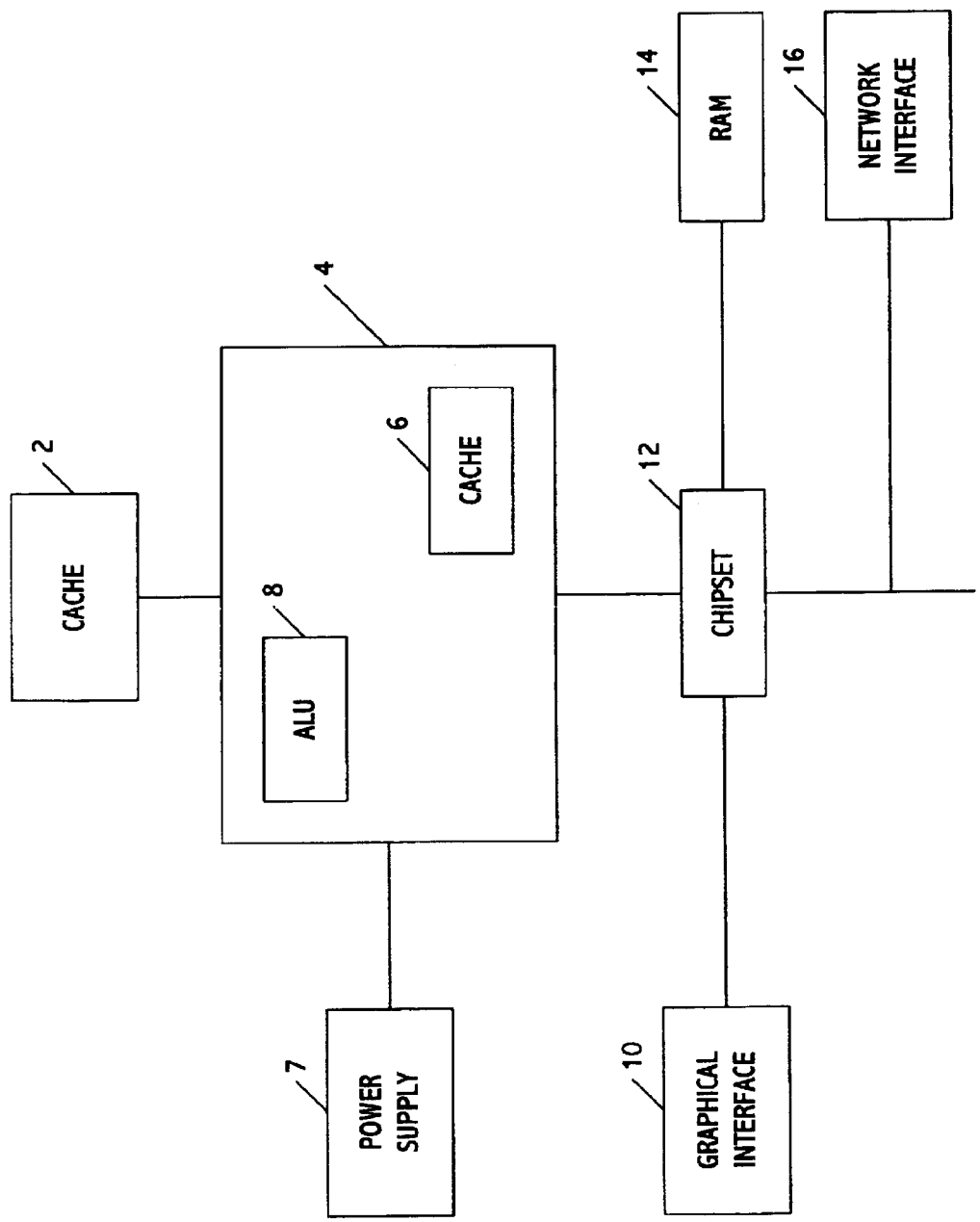
FIG. 1 is an exemplary global diagram of a portion of a computer.

FIG. 1 is an exemplary global illustration of a computer. The computer may include processor 4, which acts as a brain of the computer. Processor 4 may be formed on a die. Processor 4 may include an Arithmetic Logic Unit (ALU) 8 and may be included on the same die as processor 4. ALU 8 may be able to perform continuous calculations in order for processor 4 to operate. Processor 4 may include cache memory 6, which may be for temporarily storing information. Cache memory 6 may be included on the same die as processor 4. The information stored in cache memory 6 may be readily available to ALU 8 for performing calculations. A computer may also include an external cache memory 2 to supplement internal cache memory 6. Power supply 7 may be provided to supply energy to processor 4 and other components of a computer. A computer may include chip set 12 coupled to processor 4. Chip set 12 may intermediately couple processor 4 to other components of the computer (e.g., graphical interface 10, Random Access Memory (RAM) 14, and/or a network interface 16). One exemplary purpose of chip set 12 is to manage communication between processor 4 and these other components. For example, graphical interface 10, RAM 14, and/or network interface 16 may be coupled to chip set 12.

Figure 2:
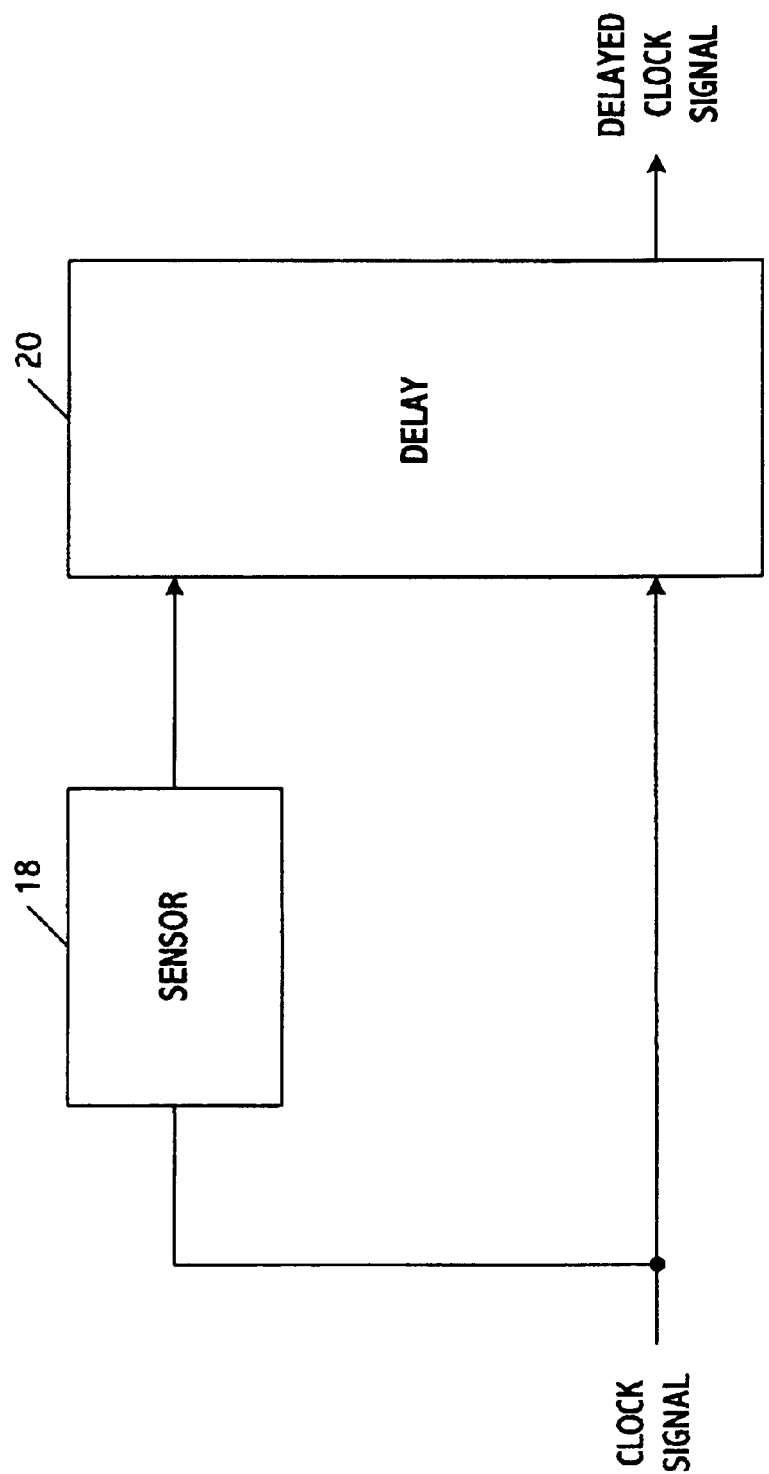
FIG. 2 is an exemplary diagram illustrating a sensor and a delay.

FIG. 2 is an exemplary block diagram illustrating how a clock signal can be dynamically delayed. A clock signal, which is to be delayed, may be input into both sensor 18 and delay 20. Sensor 18 may be configured to sense the frequency of the input clock signal and/or the operating conditions of a circuit. The output of sensor 18 may be input into delay 20. The clock signal input into delay 20 may be delayed by delay 20 according to the output of sensor 18. The output of sensor 18 may be a signal indicative of a sensed frequency of the clock signal. The signal output from sensor 18 may be utilized by delay 20 to vary the amount of delay of the delay clock signal. In other words, in accordance with at least one embodiment of the present invention, a delay time of a clock signal may be varied in response to a sensed frequency of the clock signal.

At least one embodiment of the present invention may be implemented in a microprocessor. In microprocessors, a large amount of logic operations may be performed during each clock cycle of a clock signal. Some of these logic operations are dependent. In accordance with at least one embodiment, a logic operation may be implemented as a circuit. In the case when the circuit is an electrical circuit, a logic operation may be implemented using electrical components, such as transistors, resistors, capacitors, and inductors. In each logic operation circuit, the logic operation may be triggered by a clock signal. A clock signal is typically a periodic signal. A clock cycle may be one period of the periodic clock signal. In every clock cycle, a logic operation may be performed in a logic operation circuit. In other words, each clock cycle may drive a logic operation circuit.

Figure 3:
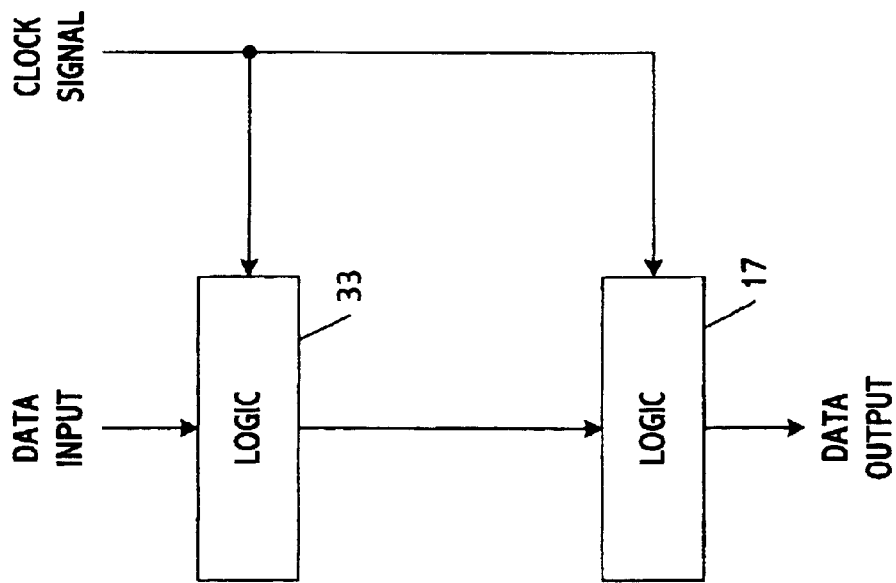

FIG. 3 is an exemplary illustration of an implementation of two logic functions that are dependent. For example, during a first clock cycle, logic operation circuit 33 (logic 33) may receive a Data Input. During the first clock cycle, logic 33 may perform a logical function of the Input Data and then output the result of that logical function to logic 17. During a second clock cycle, which is subsequent to the first clock cycle, logic 17 may perform a logical function of the output from logic 17. Accordingly, the input to logic 17 is dependent on the output from logic 33. At least for this reason, logic 33 and logic 17 cannot be triggered at the same time. This is evident and apparent, as logic 33 must perform its logic operation prior to logic 17 performing its logic operation. If logic 33 and logic 17 are triggered at the same time by a clock signal, logic 17 will not be able to utilize the output from logic 33. Accordingly, logic 33 and logic 17 perform their logical operations during different clock cycles.

Figure 4:
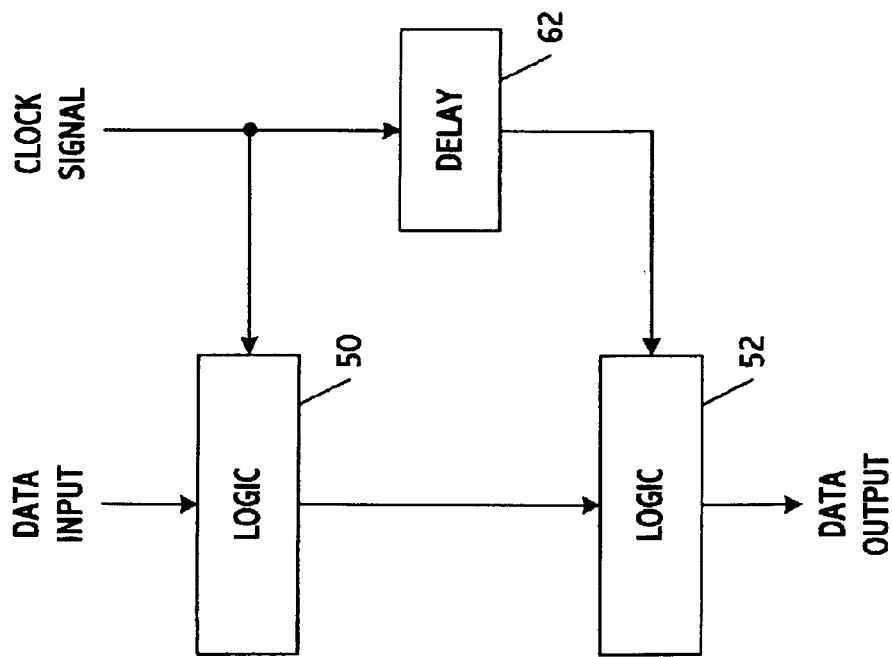
FIGS. 3 and 4 are exemplary diagrams illustrating dependent logic operation circuits implemented in a single clock cycle.

FIG. 4 is an exemplary illustration of the implementation of two logic operations performed in a single clock cycle. In at least one embodiment, logic 50 and logic 52 of FIG. 4 may have the same logical operations as logic 33 and logic 17 of FIG. 3, respectively. In other words, logic 50 may perform the same logic operation as logic 33 and logic 52 may perform the same logic operation as logic 17. However, logic 50 and logic 52 may be implemented in a single clock cycle by utilizing delay 62. Assuming that the time period of a clock cycle applied in FIG. 3 and FIG. 4 are identical, the cumulative logic operations of logic 50 and logic 52 of FIG. 4 may be processed in half the time as the cumulative logic operations of logic 33 and logic 17 of FIG. 3. In other words, the circuit structure illustrated in FIG. 4 takes only one clock cycle while the circuit structure implemented in FIG. 3 takes two clock cycles. Accordingly, the circuit structure implemented in FIG. 4 would take half the time as the circuit structure illustrated in FIG. 3 to perform the same sequence of logical operations. One of ordinary skill in the art would appreciate that implementing more dependent logic operations in the same clock cycle is advantageous, as more logic operations can be accomplished in a shorter amount of time. One of ordinary skill in the art would also appreciate that more than two dependent logic operations could be implemented in a single clock cycle.

In one or more embodiments of the present invention, there is a race between the clock signal that drives logic 50 and the delayed clock signal that drives logic 52. The delay between the clock signal that drives logic 50 and the delayed clock signal that drives logic 52 may be referred to as a race margin. The race margin is preferably long enough, such that the operation of logic 50 is completed before the operation of logic 52 begins. However, the race margin may be short enough such that both the operation of logic 50 and the operation of logic 52 are completed in the same clock cycle.

During implementation of multiple dependent logical operations in a single clock cycle, it may be desirable to minimize the delay of the clock signal between dependent logic circuits. For example, in FIG. 4, it may be desirable for delay 62 to delay the clock signal just enough such that when logic 50 outputs data, logic 52 is triggered. However, if a clock signal is not delayed enough, logic 52 would be triggered before receiving the output from logic 50. In this circumstance, the logic of the circuitry would fail. Accordingly, if delay 62 is a static delay device, then the delay must be adequate such that a failure will not occur. Further, the delay between the performance of logic 52 and logic 50 may be minimized so that multiple logic operations can be performed in a single clock cycle. One of ordinary skill in the art would appreciate that the total time consumed by logic 50, delay 62, and logic 52 cannot exceed the time period of a single clock cycle of the clock signal.

There may be variances in the frequency of a clock signal. In accordance with at least one embodiment, delay 62 must accommodate for these variances. For example, when the frequency of a clock signal is relatively high, the total time consumed by logic 50, delay 62, and logic 52 must not exceed the time period of a single clock cycle at this relatively high frequency. Accordingly, in order to satisfy this tolerance, a relatively short static delay may be implemented. However, this relatively short static delay may not be adequate, if the frequency of the clock signal shifts to a lower frequency during normal variation of the clock frequency. Accordingly, dynamic delay circuitry, as illustrated in embodiments exemplified in FIG. 2, may be implemented to allow dependent logic to be implemented, regardless of normal variances in clock frequency. Accordingly, a circuit with more than one logic operation implemented in the same clock cycle will be relatively efficient and effective.

Figure 5:
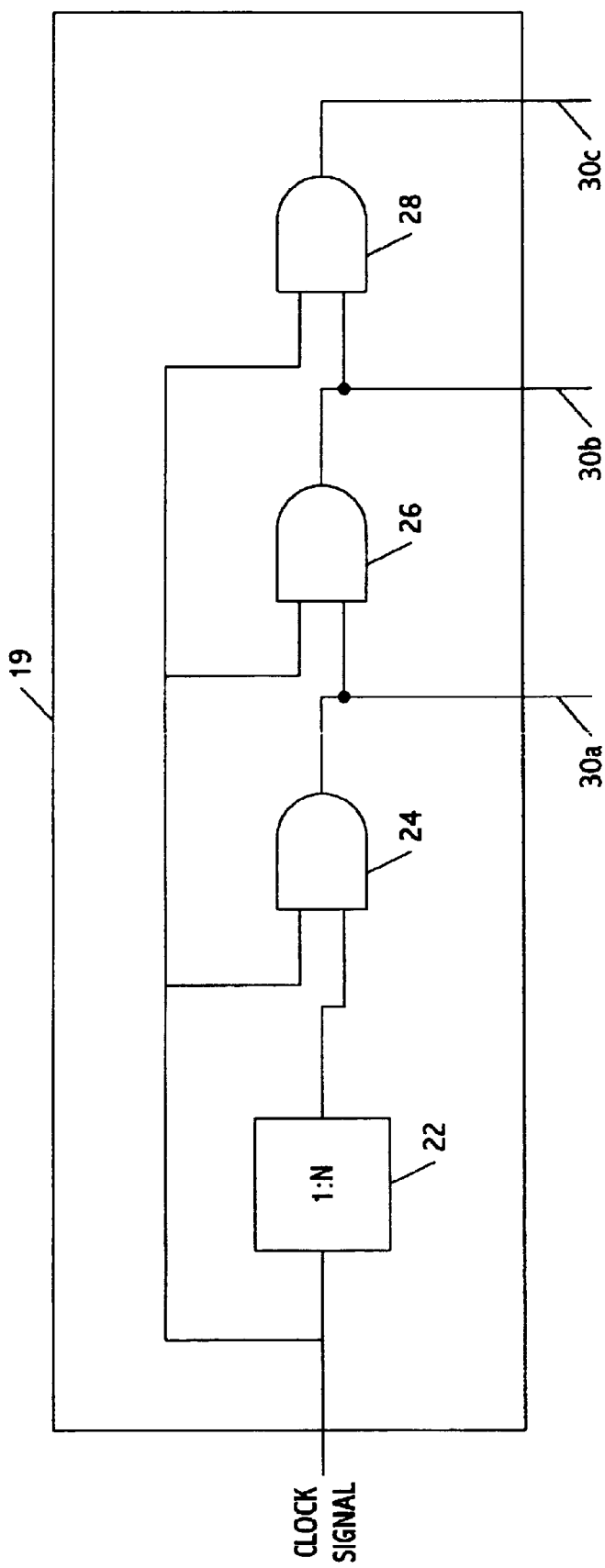
FIG. 5 is an exemplary illustration of a sensor.

FIG. 5 is an exemplary illustration of a sensor for sensing a frequency of a clock signal. In at least one embodiment, sensor 19 of FIG. 5 may be implemented as sensor 18 of FIG. 2, and sensor 19 may be a clock chopper circuit. Clock divider 22 may reduce the frequency of the input clock signal by a factor N. In at least one embodiment, N may be two and the output of divider 22 will be a clock signal with half the frequency of the input clock signal. AND gate 24, AND gate 26, and AND gate 28 may have both a delay attribute and a logical function attribute. For example, the input into AND gate 24 may be the output of divider 22 and the clock signal. The output of AND gate 24 may be a delay of the input output from divider 22 if the clock signal is at a high level. AND gate 26 may receive the output of AND gate 24 and the clock signal. Likewise, AND gate 28 may receive the output of AND gate 26 and the clock signal. Accordingly, the outputs of AND gate 24, AND gate 26, and AND gate 28 are outputs 30*a*, 30*b*, and 30*c*. Accordingly, the number of consecutive lines 30*a*, 30*b*, and 30*c* which have a high level voltage signal may be indicative of a frequency of the clock signal. In embodiments, the output over line 30*a*, line 30*b*, and line 30*c* is a plurality of binary digits. In embodiments, the output over line 30*a*, line 30*b*, and line 30*c* are delay control bits.

Sensor 19 of FIG. 5 illustrates only three AND gates for exemplary purposes and simplification. One of ordinary skill in the art would appreciate that any number of AND gates could be used depending on the required resolution and according to design preferences. Additionally, one of ordinary skill in the art would appreciate that frequency divider 22 can be divided by any multiple to accommodate for a required resolution according to design preferences.

Figure 6:
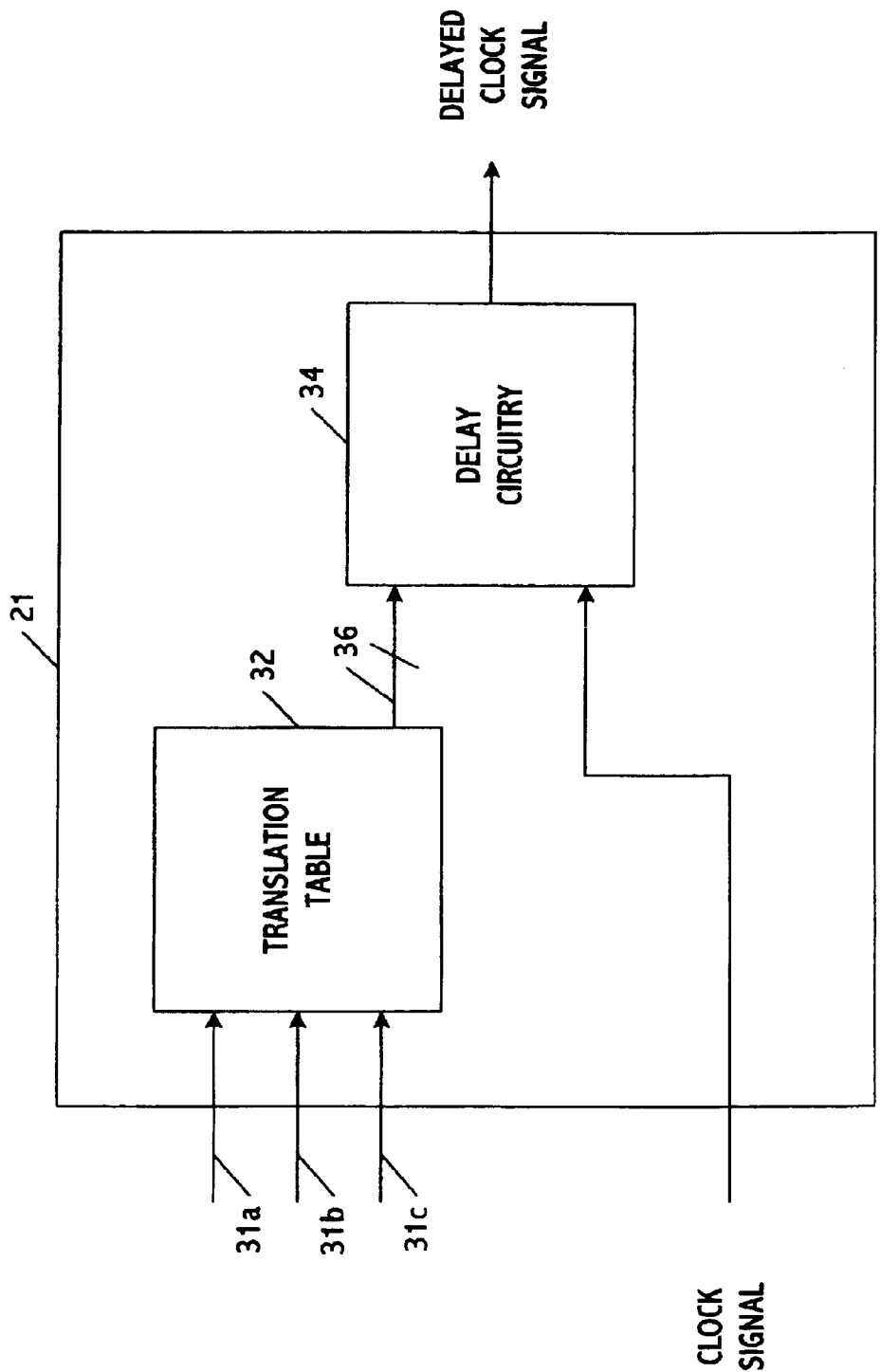
FIG. 6 is an exemplary block diagram of a delay.

FIG. 6 is an exemplary illustration of a delay. Delay 21 of FIG. 6 may be implemented as delay 20 of FIG. 2. Input into delay 21 are lines 31*a*, 31*b*, 31*c* and a clock signal. In accordance with at least one embodiment, lines 31*a*, 31*b*, and 31*c* may be the output of sensor 18 of FIG. 2. In accordance with at least one embodiment, these lines may be the output of sensor 19 of FIG. 5. Line 31*a* of FIG. 6 may correspond to line 30*a* of FIG. 5, line 31*b* of FIG. 6 may correspond to line 30*b* of FIG. 5, and line 31*c* of FIG. 6 may correspond to line 30*c* of FIG. 5. The clock signal input into delay 21 may be input into delay circuitry 34. According to the parameters of delay circuitry 34, delay circuitry 34 may output a delayed version of the input clock signal. Delay 21 may be a time delay register, although other circuit elements are possible.

Translation table 32 may receive signals from line 31*a*, line 31*b*, and line 31*c*. Translation table 32 may then output at least one signal 36 to delay circuitry 34. The at least one signal 36 may control the amount of delay of delay circuitry 34. In other words, the delayed clock signal output from delay circuitry 34 may be delayed by an amount according to the plurality of signals 36 output from translation table 32. Translation table 32 may delay a clock signal by correlating a predetermined time delay as a function of a sensed frequency of the clock signal. In at least one embodiment, this function is a linear relationship between the frequency of a clock signal and the delay of the clock signal. Translation table 32 may be constructed either empirically or theoretically and may comprise logical circuitry. The logical circuitry may correlate the output of a frequency sensor to control signals that drive delay circuitry 34. Control circuitry 34 are driven according to a predetermined relationship between the frequency of a clock signal and the necessary amount of delay of the clock signal.

Only three lines [e.g., line 31*a*, line 31*b*, and line 31*c*] are illustrated for simplification. However, one of ordinary skill in the art would appreciate that more than three lines may be implemented. The amount of sensor lines may be equivalent to the number of outputs from sensor 19. One of ordinary skill in the art would appreciate the at least one signal 36 output from translation table 32 may be a plurality of parallel wire lines or a single wire line communicating a signal. The at least one signal 36 may be the signal that directly controls the delay of delay circuitry 34.

Figure 7:
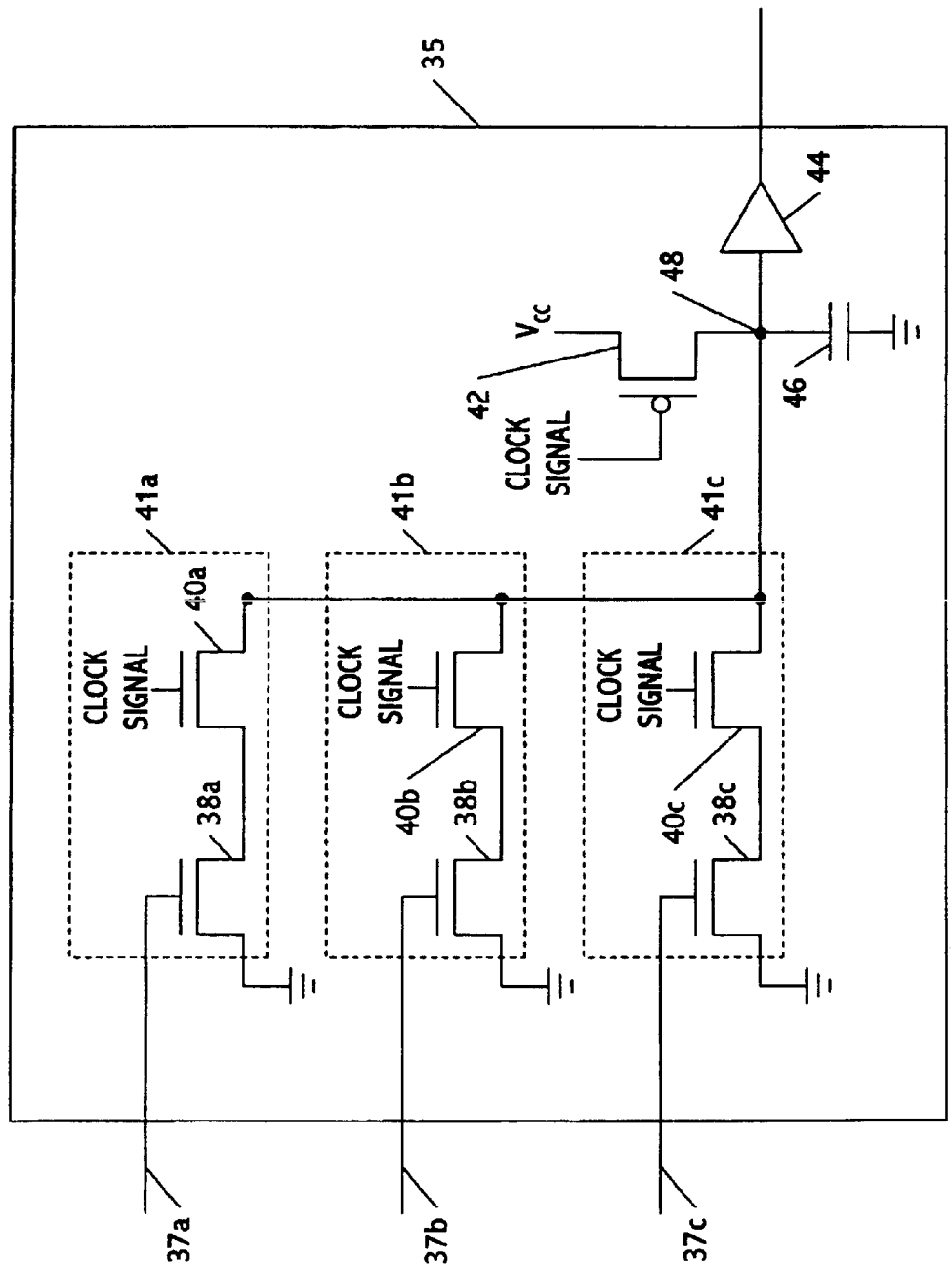
FIG. 7 is an exemplary illustration of delay circuitry.

FIG. 7 is an exemplary illustration of delay circuitry. This circuitry may correspond to delay circuitry 34 of FIG. 6. Delay circuitry 35 may receive line 37a, line 37b, line 37c, and a clock signal. Line 37a, line 37b, and line 37c may correspond to the at least one signal 36 of FIG. 6. Capacitor 46 may be connected between node 48 and ground. Capacitor 46 may be precharged by power supply voltage Vcc through transistor 42, when the clock signal is at a low voltage level. Transistor 42 may have an inverted gate input such that Vcc is connected to capacitor 46 when the clock signal is at a low voltage level. When the clock signal is at a high voltage level, transistors 40a, 40b, and 40c may be in a highly conductive state. Likewise, when input 37a is at a high level, transistor 38a is in a highly conductive state; when input 37b is at a high voltage level, transistor 38b is in a highly conductive state; and when input 37c is at a high voltage level, transistor 38c is in a highly conductive state.

When the clock signal is at a high voltage level during each clock cycle, node 48 of capacitor 46 is connected to ground through a plurality of electrically resistant paths. The number of resistant paths which are connected to node 48 is depending on how many of line 37a, line 37b, and line 37c are at a high voltage level. Accordingly, the number of these lines which are at a high voltage level at a given time, determines how fast capacitor 46 discharges. The speed at which capacitor 46 is discharged effects the output of buffer 44. Consequently, the output of buffer 44 is a delayed version of the input clock signal.

In accordance with at least one embodiment, the number of lines (e.g., line 37a, line 37b, and line 37c) which are at a high voltage level is dependent on the frequency of the clock signal detected at the sensor 18. Transistor 38a and 40a may form cell 41a. Likewise, transistors 38b and 40b may form cell 41b. Further, transistors 38c and 40c may form cell 41c. Only three exemplary cells are illustrated for simplification. However, one of ordinary skill in the art would appreciate that a plurality of cells may be implemented. In some embodiments, 64 cells are implemented. For each cell, a corresponding parallel line may be connected from a translation table. The number of cells which are activated during a given cycle may have a relationship to the delay of the clock signal output from delay circuitry 35.

Embodiments of the present invention relate to races in synchronous systems that occurs when two signals start propagating from one common point and the functionality of receiving circuitry requires that one signal become valid before the other signal. If this requirement is violated, then there may be a functional failure. This failure may not be able to be resolved by reducing the clock frequency or by moving to faster operating conditions, since the two signals are starting to propagate from the same edge of the clock.

Races in high-speed digital circuits may be implemented to achieve improved performance. Races may be utilized to improve performance when the gap between the valid-time of two signals is smaller than clock phase time. Accordingly, converting a race to a synchronous path may make use of an unused timing window. An example of a race in a high-speed CPU is a race between a cache sense-amplifier enabling signal and a cache memory array word-line. Another example is a race between activation of an AND-plane and evaluation of an OR-plane in dynamic Programmable-Logic-Arrays.

Embodiments of the present invention relate to a race in high speed embedded cache memories between a Sense-Amp Enable (SAE) signal and a memory array Word-Line (WL). SAE activation may occur after WL assertion in order to develop a minimum required differential signal between memory array bit-lines. When SAE and WL are activated by the same edge of the clock, there may be a functional race.

In embodiments, circuitry generates a delay (Dsae) between WL and SAE that may behave like a synchronous path. Equation 1 illustrates an exemplary required function of Dsae verses the clock cycle-time (Tcyc). Equation 1 is representation of an exemplary expression for the delay between two signals that are generated by different edges of the clock.

$$Dsae = D0 + K*Tcyc \qquad \text{Equation (1)}$$

In regular synchronous paths, K=1 if two signals are from two adjacent cycles. Likewise K=0.5 if two signals are from two adjacent phases. In embodiments where a synchronous solution for two signals is within the same phase, K may be less than 0.5.

Figure 8:
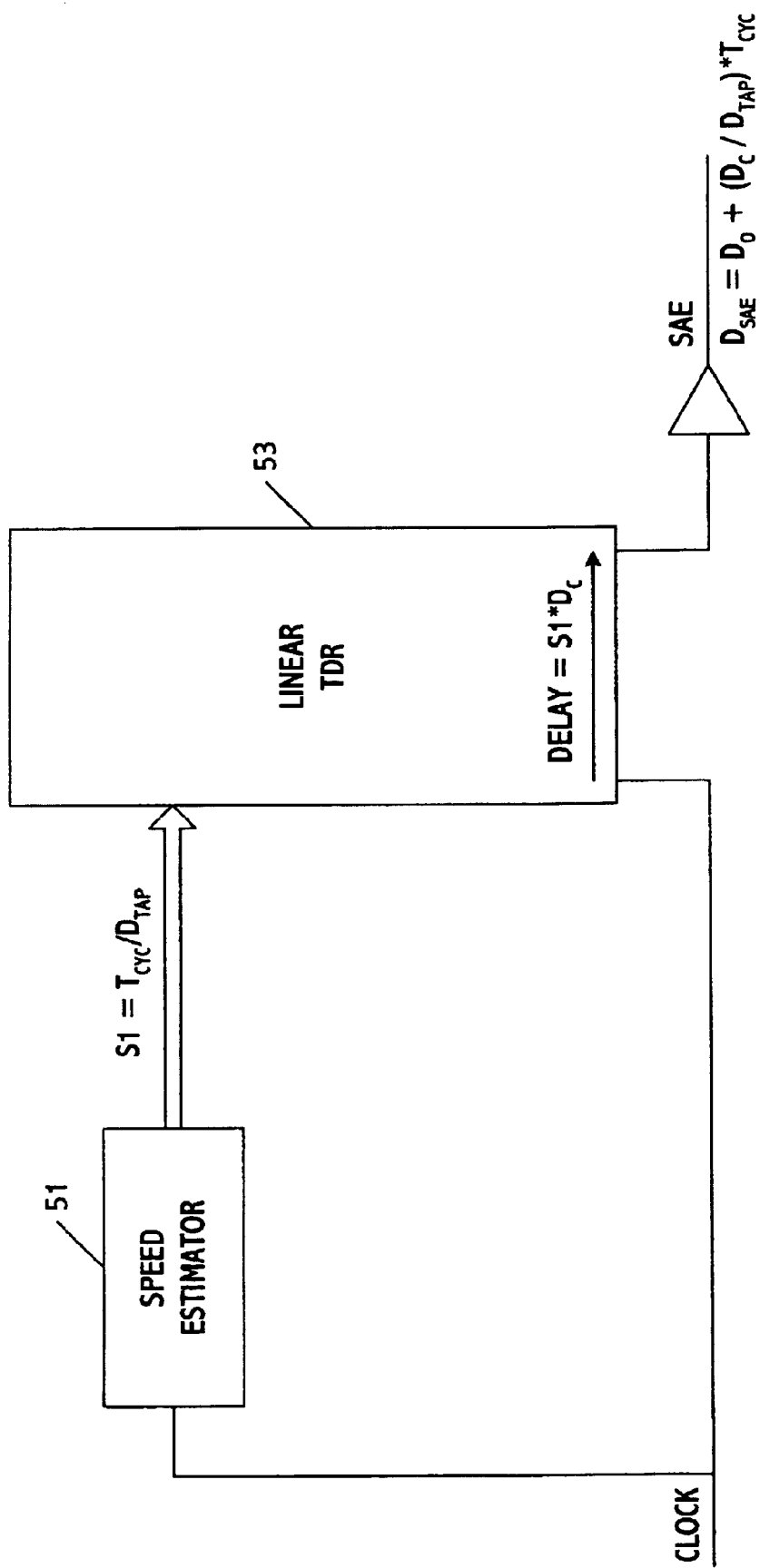
FIGS. 8–12 illustrate exemplary embodiments of the present invention.

Embodiments of the present invention may include a Speed Estimator (SPE) 51 and a Linear Time-Delay-Register (LTDR) 53 as the two basic compounds illustrated in FIG. 8. SPE 51 and LTDR 53 may include CMOS devices. The SPE 51 may generate a fix width vector (S) in which the number of bits that are at a high state (S1) is linearly dependent on the clock frequency at given operating conditions. Equation 2 is an exemplary expression for S1, where Dtap is the delay of one tap in SPE 51.

$$S1 = Tcyc/Dtap \qquad \text{Equation (2)}$$

LTDR 53 may be a programmable delay element, wherein the delay (Dtdr) is linearly controlled by a digital word. Equation 3 is an exemplary representation of the delay of LTDR 53, where S1 is the number of bits that are at high state in the input data word. Dc is an exemplary representation of fixed delay and it may be a parameter of LTDR 53.

$$Dtdr = D0 + S1*Dc \qquad \text{Equation (3)}$$

Accordingly, the connection of SPE 51 to LTDR 53 to output SAE, as shown in FIG. 8, can be represented by the exemplary expression of Equation 4 for the delay of SAE, after combining Equation 2 and Equation 3.

$$Dsae = D0 + (Dc/Dtap)*Tcyc \qquad \text{Equation (4)}$$

Dtap and Dc may be delay parameters of the SPE 51 and the LTDR 53. Dtap and Dc may respond to operating conditions (i.e., supply voltage, temperature, and process parameters). The ratio of Dc/Dtap may be a fixed number. Accordingly, the delay between the WL and SAE may behave like a regular synchronous path, as described by Equation 1, with K=Dc/Dtap.

Figure 9:
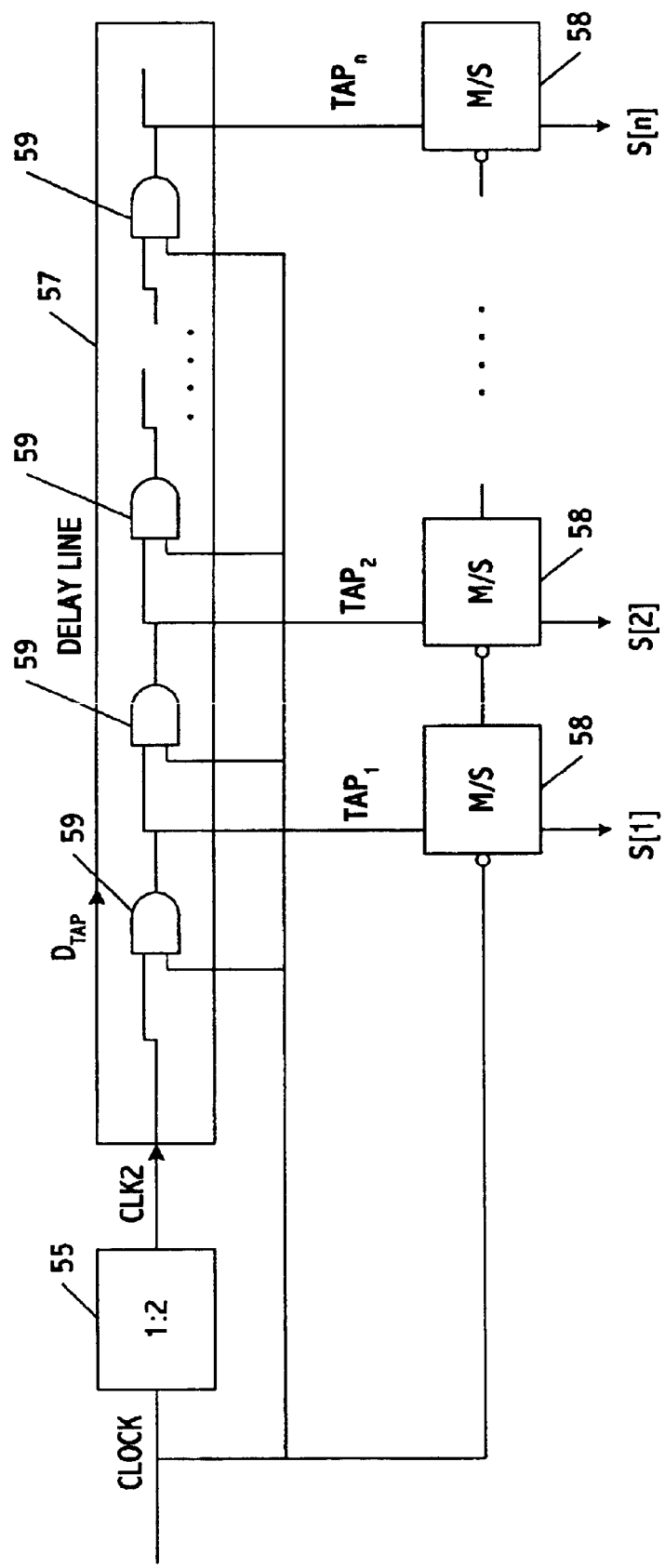
Figure 10:
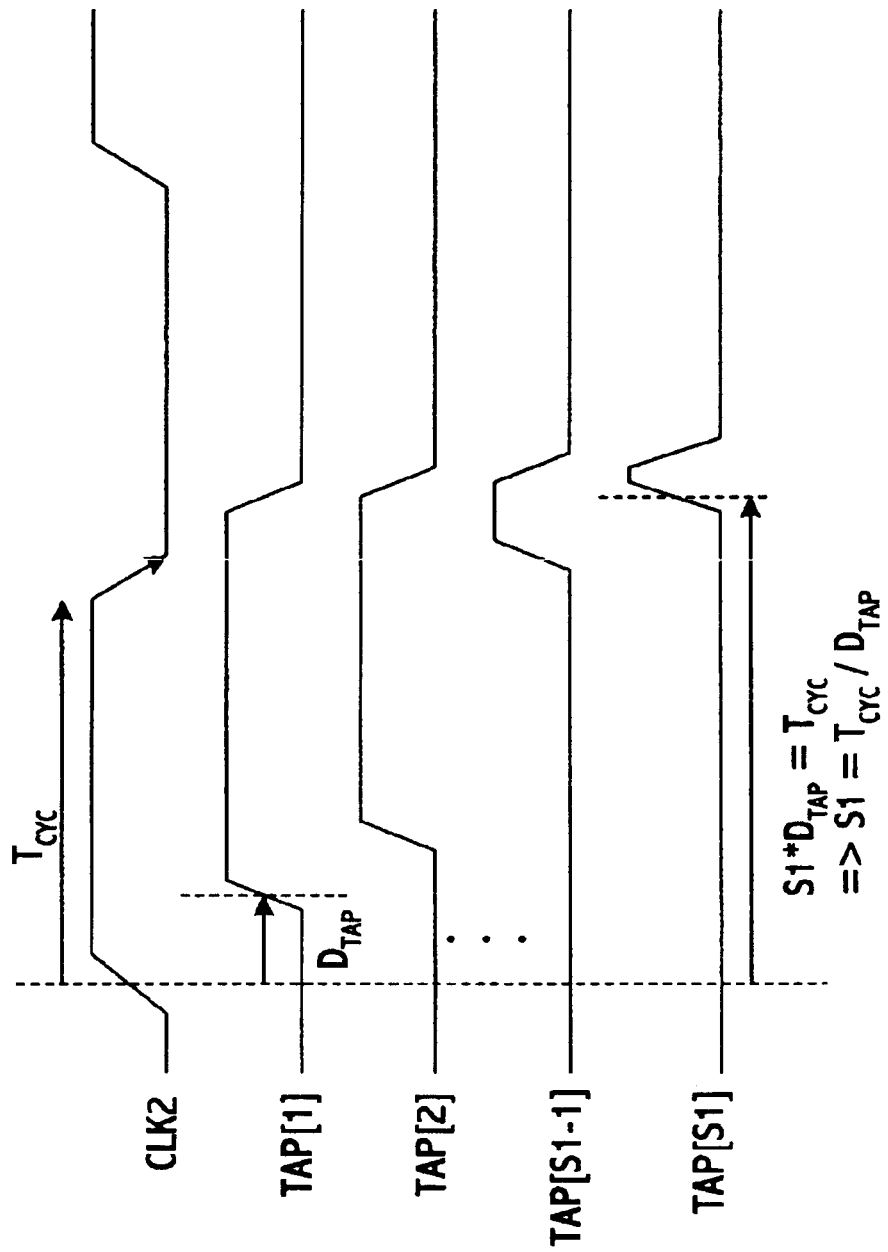

FIG. 9 illustrates an exemplary implementation of SPE 51. This implementation may include a clock divider 55 that generates a half frequency clock (CLK2) with a phase time that is equal to Tcyc of the main clock. CLK2 may feed a simple chain of N delay elements 57 that are connected in a clock chopper configuration. The delay of each element 59 of N delay elements 57 is Dtap. The clock is ANDed with the outputs of each element 59 along the chain. The output of clock-AND[i] is a signal that rises i*Dtap [pS] after the clock rising edge, and falls immediately after the clock falling edge, as illustrated in FIG. 10. The taps may be sampled by falling edge of triggered flip flops 58. The outputs of these flip flops 58 may be the required vector S defined by Equation 2.

Figure 11:
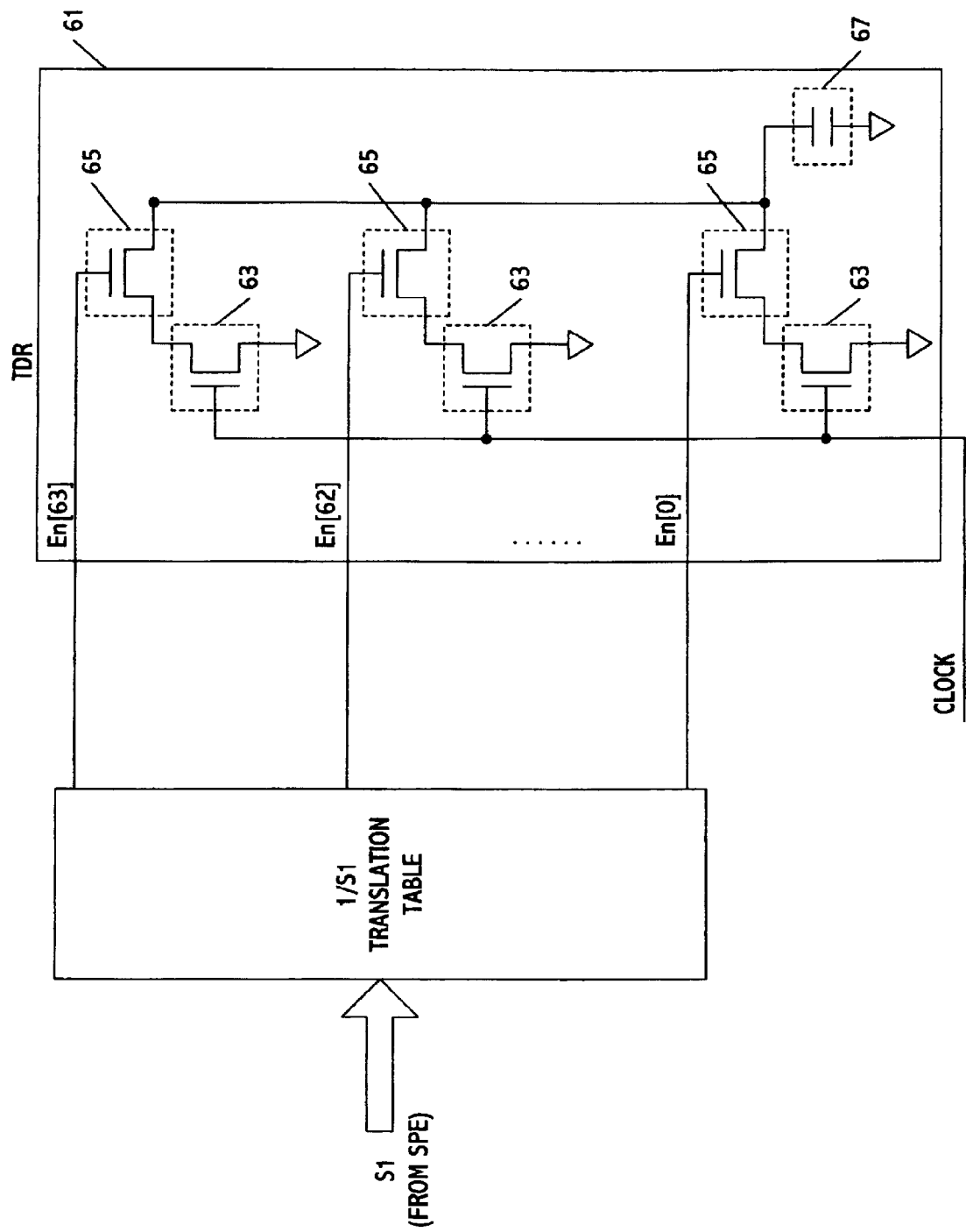

LTDR 53 may be implemented, in embodiments of the present invention, as shown in FIG. 11. TDR 61 may be similar to a programmable delay component. TDR 61 may have a set of small devices 63 that are connected through a set of sixty-four switches 65 to a capacitor 67. Sixty-four switches 65 control how many elements will discharge capacitor 67. Therefore, the delay of TDR 61 may be proportional to an inverse of the number of driving elements. Equation 5 is an exemplary representation of the delay of TDR 61, wherein N is the number elements (i.e., sixty-four) that are enabled to discharge capacitor 67.

$$Dtdr = K3/N \quad \text{Equation (5)}$$

In order to obtain a linear ratio between the delay of LTDR 53 and the input data word that is coming from the SPE 51, the number of driving cells may be proportional to 1/S1. This may be achieved by connecting each bit from SPE 51 to a variable number of cells in TDR 53. When S1=0, TDR 53 is at maximum speed and the number of driving cells may be at maximum value -n(0). When S1 increases to 1, the number of driving cells may be reduced by Dn(0). When S1 increases from 1 to 2, the number of driving cells may be reduced by Dn(1), which is smaller than Dn(0), since now less cells are driving so the weight of each eliminated cell is greater.

An exemplary mathematical solution of Equations 6–10 illustrate that the number of cells that should be disabled (Dn) is a function of the current number of driving cells (n) and the number of high bits in the input vector (S1). To get a linear response, the derivative of the function Dtdr(S1) should be constant.

$$DDtdr/DS1 = Dc \quad \text{Equation (6)}$$

The following set of equations extracts the derivative Dn/DS1 (i.e., how many cells should be disconnected when S1 increases by 1).

$$DDtdr/DS1 = (DDtrd/Dn)*(Dn/DS1) \quad \text{Equation (7)}$$

$$DDtdr/Dn = -K3/n^2 \text{ (from Equation 5)} \quad \text{Equation (8)}$$

Combining Equation 6, Equation 7 and Equation 8 gives:

$$Dn/DS1 = -(Dc/K3)*n^2 \quad \text{Equation (9)}$$

Therefore, if the current value of driving cells is n, then when S1 increase by 1, the next value of n is given by:

$$n(S1+1) = n(S1)B(Dc/K3)*[n(S1)]^2 \quad \text{Equation (10)}$$

Below is an example of how many cells should be disabled as S1 increases from 0. Assume that the delay coefficient K3 of the TDR is 630 pS and that the required fixed delay step Dc is 3pS. The initial value n(0) is 41 cells.

$$n(1) = 41B(3/630)*41^2 = 33$$

$$n(2) = 33B(3/630)*33^2 = 28$$

Table 1 is an exemplary full set of n(S1) when S1 grows from zero to twelve. The values are rounded to the closest integer number. Beyond twelve, __n(S1) is smaller than 0.5 and the LTDR may become non-linear. However, the available linear range may be wide enough for practical design purposes.

TABLE 1

| S1 | n(S1) | Δn(S1) |
|----|-------|--------|
| 0  | 41.0  | 8.0    |
| 1  | 33.0  | 5.2    |
| 2  | 27.8  | 3.7    |
| 3  | 24.1  | 2.8    |
| 4  | 21.4  | 2.2    |
| 5  | 19.2  | 1.8    |
| 6  | 17.4  | 1.4    |
| 7  | 16.0  | 1.2    |
| 8  | 14.8  | 1.0    |
| 9  | 13.7  | 0.9    |
| 10 | 12.8  | 0.8    |
| 11 | 12.1  | 0.7    |
| 12 | 11.4  | 0.6    |

Figure 12:
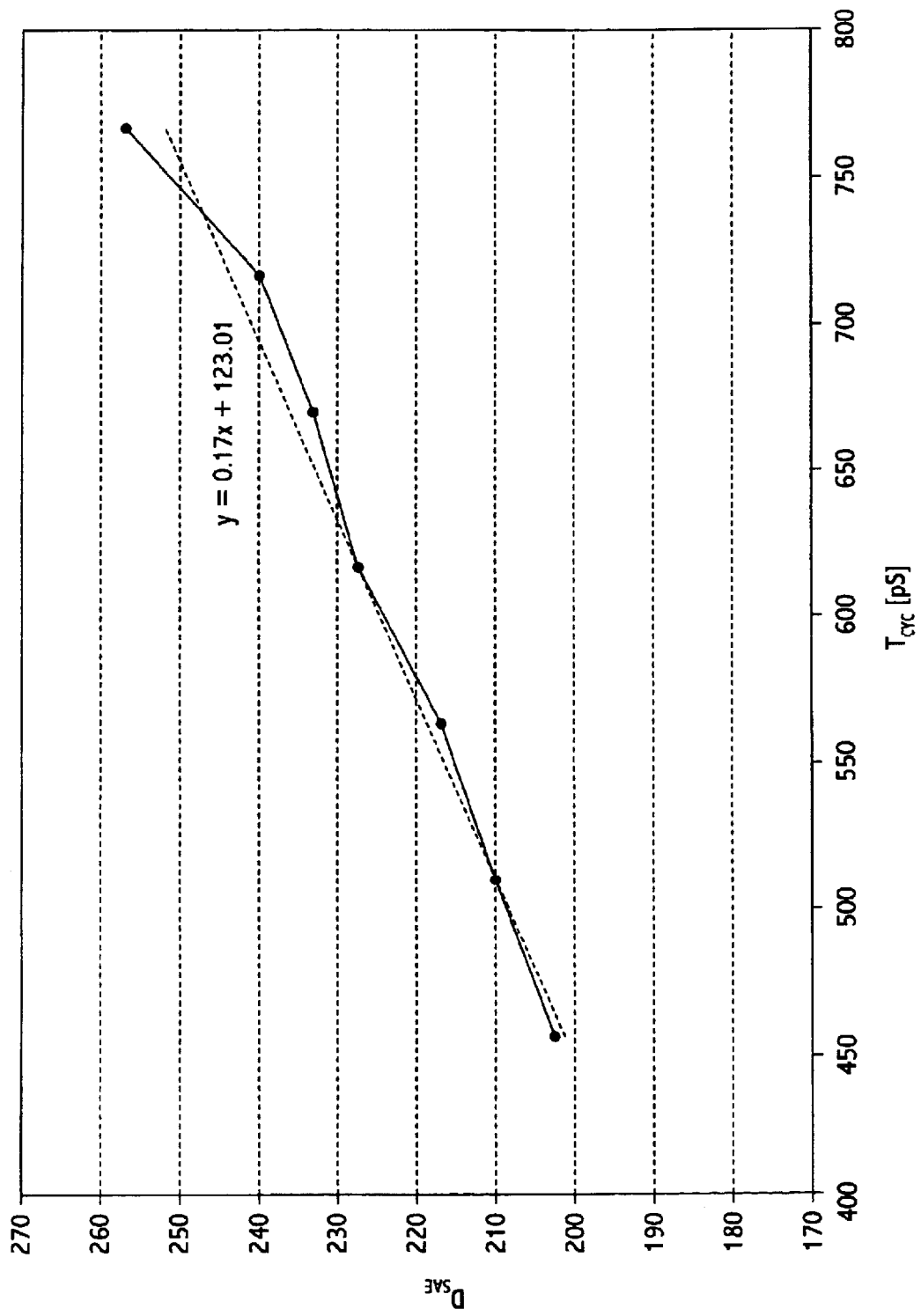

FIG. 12 is an exemplary graph of Dsae vs. Tcyc. The delay parameters in this design are Dc=3 pS and Dtap=21 pS. Therefore, an expected slope of the curve is 0.14. It may be appreciated that SAE behaves almost like a synchronous circuit with a delay that is linearly dependent on Tcyc within a wide range of the frequency. Therefore, the race conditions between the WL and SAE may be removed.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An apparatus comprising:
    a circuit to vary a delay time of a clock signal in response to a frequency of the clock signal, wherein the circuit includes a sensor and a delay circuit, the sensor outputs a determination of the frequency of the clock signal, and a delay time of the delay circuit is responsive to the determination of the frequency of the clock signal.

2. The apparatus of claim 1, wherein the apparatus is comprised in a microprocessor.

3. The apparatus of claim 1, wherein the sensor comprises a clock chopper circuit.

4. The apparatus of claim 1, wherein the determination of the frequency of the clock signal includes a plurality of binary digits.

5. The apparatus of claim 4, wherein the plurality of binary digits are output from the sensor in parallel.

6. The apparatus of claim 1, wherein the delay circuit includes a time delay register.

7. The apparatus of claim 1, wherein the delay time is a linear function of the determination of the frequency of the clock signal.

8. The apparatus of claim 1, wherein:
    the determination of the frequency of the clock signal includes a plurality of binary digits; and
    the delay time of the delay circuit is responsive to a number of digits of the plurality of binary digits that are output from the sensor at a predetermined voltage level.

9. The apparatus of claim 8, wherein a relationship between the number of digits of the plurality of binary digits that are output from the sensor at said predetermined voltage level and the delay time is a linear relationship.

10. The apparatus of claim 1, wherein:
    the delay circuit comprises a translation table and a plurality of delay elements; and
    the translation table is configured to activate at least one combination of the delay elements responsive to the determination of the frequency of the clock signal.

11. The apparatus of claim 10, wherein:
each delay element of the plurality of delay elements includes a switch; and
the plurality of delay elements are coupled to a capacitor in parallel.

12. The apparatus of claim 11, wherein a relationship between a number of activated delay elements and the delay time is a nonlinear relationship.

13. The apparatus of claim 11, wherein the switch is configured to connect the capacitor to ground if activated during a clock cycle.

14. The apparatus of claim 11, wherein the switch is a transistor.

15. A method for generating clock signals, comprising:
determining a frequency of a clock signal; and
varying a delay time of the clock signal in response to the frequency of the clock signal, wherein the delay time is associated with a delay circuit that is responsive to the determined frequency and wherein the frequency of the clock signal is determined by a sensor.

16. The method of claim 15, wherein the method is implemented in a microprocessor.

17. The method of claim 15, wherein the sensor comprises a clock chopper circuit.

18. The method of claim 15, wherein the determination of the frequency of the clock signal includes a plurality of binary digits.

19. The method of claim 18, wherein the plurality of binary digits are output in parallel.

20. The method of claim 15, wherein:
the determination of the frequency of the clock signal includes a plurality of binary digits; and
the delay time of the delay circuit is responsive to a number of digits of the plurality of binary digits that are output from the sensor at a predetermined voltage level.

21. The method of claim 20, wherein a relationship between the number of digits of the plurality of binary digits that are output from the sensor at a said predetermined voltage level and the delay time is a linear relationship.

22. The method of claim 15 wherein:
the delay circuit comprises a translation table and a plurality of delay elements; and
the translation table is configured to activate combinations of the delay elements responsive to the determination of the frequency of the clock signal.

23. The method of claim 22, wherein:
each delay element of the plurality of delay elements is a switch; and
the plurality of delay elements are coupled to a capacitor in parallel.

24. The method of claim 23, wherein a relationship between a number of activated delay elements and the delay time is a nonlinear relationship.

25. The method of claim 23, wherein the switch is configured to connect the capacitor to ground if activated during a clock cycle.

26. The method of claim 23, wherein the switch is a transistor.

27. A system comprising:
a die comprising a processor; and
an off-die component in communication with the processor,
wherein the processor comprises a circuit that varies a delay time of a clock signal in response to a frequency of the clock signal, wherein the circuit includes a sensor and a delay circuit, the sensor outputs a determination of the frequency of the clock signal, and a delay time of the delay circuit is responsive to the determination of the frequency of the clock signal.

28. The system of claim 27, wherein the off-die component is at least one of a cache memory, a chip set, and a graphical interface.

29. An apparatus, comprising:
a sensor to sense a frequency of a clock signal;
a translator to output a signal indicative of a predetermined delay corresponding to the sensed frequency of the clock signal; and
a delay circuit to delay the clock signal based on the signal output from the translator indicative of said predetermined delay.

30. The apparatus of claim 29, wherein the sensor includes a clock chopper circuit.

31. The apparatus of claim 29, wherein said predetermined delay is a linear function of the sensed frequency of the clock signal.

32. The apparatus of claim 29, wherein the translator includes a translation table that stores a plurality of predetermined delay times for a plurality corresponding clock signal frequencies.

33. The apparatus of claim 29, wherein the translator includes a register that stores information corresponding to said predetermined delay.

34. The apparatus of claim 29, wherein the translator includes a logic circuit that translates the sensed frequency of the clock signal into the signal indicative of said predetermined delay.

35. The apparatus of claim 29, wherein the clock signal drives a first circuit and the delayed clock signal drives a second circuit which receives an output of the first circuit.

36. The apparatus of claim 35, wherein the clock signal and delayed clock signal drive the first and second circuits respectively within a same cycle of the clock signal.

37. The apparatus of claim 29, wherein said predetermined delay corresponds to a race margin between first and second signals.

38. The apparatus of claim 37, wherein the first signal is a sense-amp enable signal and the second signal is a word line signal.

* * * * *